(12) United States Patent
Chen et al.

(10) Patent No.: US 11,195,759 B2
(45) Date of Patent: Dec. 7, 2021

(54) SEMICONDUCTOR ARRANGEMENT AND METHOD FOR MAKING

(71) Applicant: TAIWAN SEMICONDUCTOR MANUFACTURING COMPANY LIMITED, Hsin-Chu (TW)

(72) Inventors: Wei-Lun Chen, Taipei (TW); Chao-Hsien Huang, Tainan (TW); Li-Te Lin, Hsinchu (TW); Pinyen Lin, Rochester, NY (US)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 10 days.

(21) Appl. No.: 16/589,353

(22) Filed: Oct. 1, 2019

(65) Prior Publication Data

US 2020/0176320 A1  Jun. 4, 2020

Related U.S. Application Data

(60) Provisional application No. 62/773,342, filed on Nov. 30, 2018.

(51) Int. Cl.
  *H01L 21/311* (2006.01)
  *H01L 21/8234* (2006.01)
  *H01L 29/66* (2006.01)

(52) U.S. Cl.
  CPC ........... *H01L 21/823431* (2013.01); *H01L 21/31116* (2013.01); *H01L 29/66795* (2013.01)

(58) Field of Classification Search
  None
  See application file for complete search history.

(56) References Cited

U.S. PATENT DOCUMENTS

| | | | | |
|---|---|---|---|---|
| 7,833,903 | B2 * | 11/2010 | Sugiura | H01L 21/7685 438/648 |
| 9,368,394 | B1 * | 6/2016 | Hung | H01L 21/02063 |
| 2007/0202700 | A1 | 8/2007 | Leucke et al. | |
| 2010/0129958 | A1 * | 5/2010 | Chang | H01L 21/76877 438/102 |
| 2016/0293445 | A1 * | 10/2016 | Han | H01L 21/76816 |
| 2016/0308027 | A1 | 10/2016 | Chang et al. | |
| 2019/0157096 | A1 * | 5/2019 | Zhou | H01J 37/32449 |

FOREIGN PATENT DOCUMENTS

| | | |
|---|---|---|
| KR | 20070089062 A | 8/2007 |
| KR | 20160123955 A | 10/2016 |
| TW | 200723354 A | 6/2007 |
| TW | 201401441 A | 1/2014 |

* cited by examiner

*Primary Examiner* — Ali Naraghi
(74) *Attorney, Agent, or Firm* — Cooper Legal Group, LLC

(57) ABSTRACT

A method for fabricating a semiconductor arrangement includes performing a first etching of a semiconductive structure to expose a first portion of a sidewall of a first layer adjacent the semiconductive structure. The first etching forms a first protective layer on the first portion of the sidewall of the first layer, and the first protective layer is formed from a first accumulation of by-product material formed from an etchant of the first etching interacting with the semiconductive structure. The method includes performing a first flash to remove at least some of the first protective layer.

20 Claims, 5 Drawing Sheets

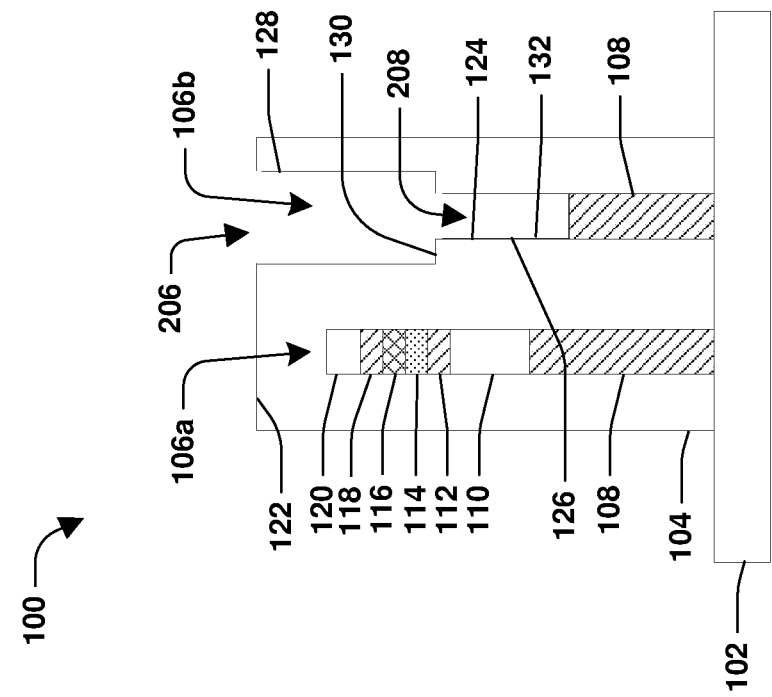
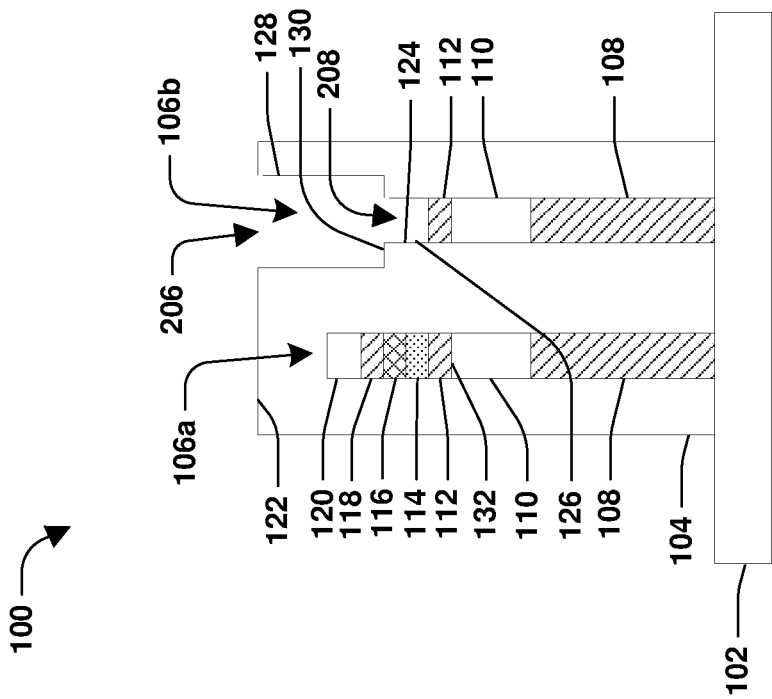

SEMICONDUCTOR ARRANGEMENT AND METHOD FOR MAKING

RELATED APPLICATIONS

This application claims priority to U.S. Provisional Application Ser. No. 62/773,342, titled "CYCLIC ETCH PROCESS FOR HIGH ASPECT RATIO ELEMENT" and filed on Nov. 30, 2018, which is incorporated herein by reference.

BACKGROUND

During semiconductor fabrication, different techniques are used to remove layers or portions of layers used in the building of semiconductor arrangements. One technique to remove layers or portions of layers is etching. Etching is a process where an etchant, such as a chemical, is applied to a layer or a portion of the layer that is to be removed. The layer or portion of the layer is often removed to expose underlying layers or features, or to define a particular pattern in the layer. The layer or portion of the layer to which the etchant is applied has a particular etch selectivity relative to the etchant such that the layer or portion of the layer is removed or etched away by the etchant. Other portions of the layer that are not to be removed are generally covered by a photoresist or hard mask that is not susceptible to the etchant or is susceptible to the etchant to a lesser degree. The portions of the layer that are not to be removed are thus protected from the etchant by the photoresist or hard mask. Once the layer or portion of the layer is etched away, the photoresist or hard mask is removed to reveal the patterned layer or remaining portions of the layer that were not etched away by the etchant.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-10 illustrate a semiconductor arrangement at various stages of fabrication, in accordance with some embodiments.

DETAILED DESCRIPTION

Figure 2:
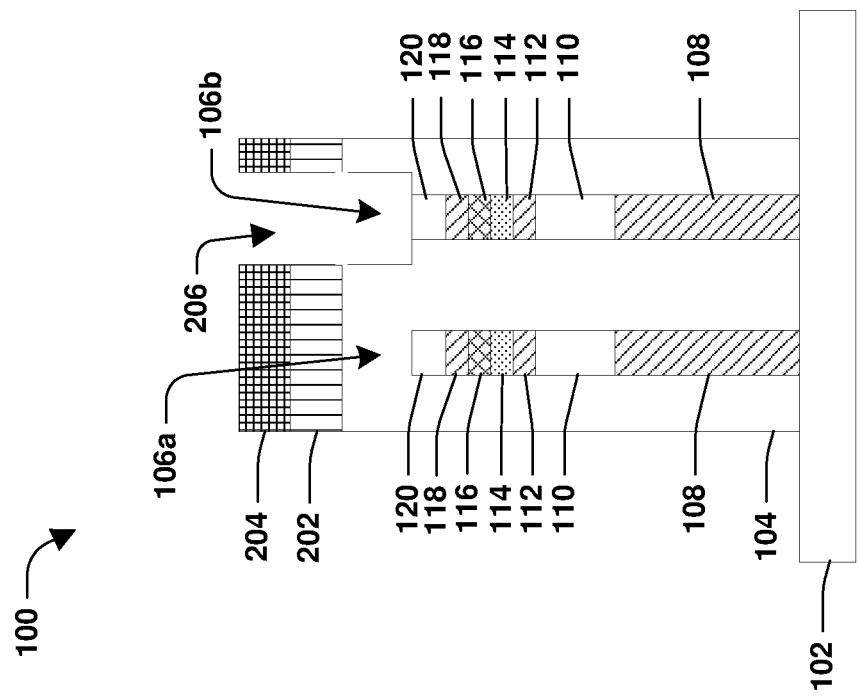

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments, a semiconductive structure, such as a fin, having a relatively high aspect ratio is etched while an adjacent dielectric layer experiences little to no etching due to a protective layer formed on one or more surfaces of the dielectric layer during the etching process. The etching process is cyclically performed along with a flashing process to remove the protective layer. A recess or trench defined by sidewalls of the dielectric layer and a top surface of the semiconductive structure is deepened during the cyclical etching process. A first portion of the semiconductive structure is removed by the etching process while the protective layer is concurrently formed on sidewalls of the dielectric layer. The protective layer inhibits an accumulation of byproducts from the etching process in the trench. The protective layer is then removed by a flashing operation. The etching operation is performed again to remove a second portion of the semiconductive structure to further deepen the trench while again concurrently forming the protective layer on surfaces of the dielectric layer to inhibit byproducts of the etching process from accumulating in the trench. Another flashing operation is performed to remove the protective layer. The process is repeatedly cycled as needed to remove a desired amount of the semiconductive structure. The protective layer also inhibits removal of the dielectric layer during the etching operations such that an upper surface of the dielectric layer remains at a desired elevation, such as to be no lower than an uppermost surface of a neighboring semiconductive structure, such as an adjacent fin.

Figure 1:
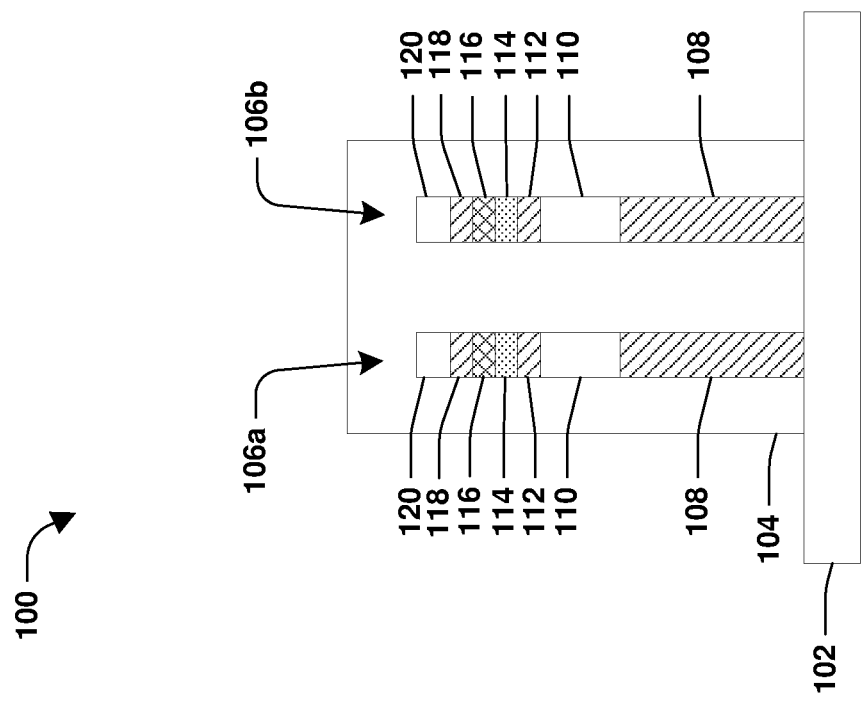

FIG. 1 illustrates a semiconductor arrangement 100 that includes a first hybrid fin 106a and a second hybrid fin 106b formed on or from a substrate 102, according to some embodiments. Although two fins 106a, 106b are illustrated, more or fewer fins are contemplated, in some embodiments. According to some embodiments, the substrate 102 comprises at least one of an epitaxial layer, a silicon-on-insulator (SOI) structure, a wafer, or a die formed from a wafer. In some embodiments, the substrate 102 is etched to form at least one of at least some of the first hybrid fin 106a or at least some of the second hybrid fin 106b. In some embodiments, the substrate 102 is doped before being etched. In some embodiments, the substrate 102 is doped after being etched. In some embodiments, at least one of at least some of the first hybrid fin 106a or at least some of the second hybrid fin 106b is grown from the substrate 102. In some embodiments, a seed layer is used to grow at least one of at least some of the first hybrid fin 106a or at least some of the second hybrid fin 106b.

In some embodiments, one or more layers are formed on the substrate 102 and patterned, such as via etching, to form at least one of at least some of the first hybrid fin 106a or at least some of the second hybrid fin 106b. In some embodiments, at least one of the first hybrid fin 106a or the second hybrid fin 106b comprise multiple layers. In some embodiments, at least one of the first hybrid fin 106a or the second hybrid fin 106b comprise at least one of a first silicon (Si)

layer 108, a silicon germanium (SiGe) layer 110, a second Si layer 112, a pad oxide layer 114, a silicon carbide nitrogen (SiCN) layer 116, a pad Si layer 118, a silicon nitride (SiN) layer 120, or other suitable materials. Other embodiments are contemplated and the instant disclosure is not limited to the aforementioned layers. In some embodiments, the first hybrid fin 106a and the second hybrid fin 106b have a same composition. In some embodiments, the first hybrid fin 106a and the second hybrid fin 106b do not have a same composition.

In some embodiments, a dielectric layer 104 is formed over at least one of an uppermost surface and sidewalls of the first hybrid fin 106a or an uppermost surface and sidewalls of the second hybrid fin 106b. In some embodiments, the first hybrid fin 106a is adjacent the second hybrid fin 106b. In some embodiments, there are no intervening structures between the first hybrid fin 106a and the second hybrid fin 106b. In some embodiments, merely the dielectric layer 104 is between the first hybrid fin 106a and the second hybrid fin 106b. In some embodiments, the dielectric layer 104 comprises at least one of a polymer, polybenzobisoxazole (PBO), a polyimide (PI), oxide, nitride, silicon, germanium, carbide, gallium, arsenide, germanium, arsenic, indium, silicon oxide, sapphire, or other suitable materials. In some embodiments, the dielectric layer 104 is formed by at least one of physical vapor deposition (PVD), spin coating sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), or other suitable techniques.

FIG. 2 illustrates the semiconductor arrangement 100 with a hard mask layer 202 and a photoresist layer 204 formed over the dielectric layer 104, according to some embodiments. In some embodiments, the photoresist layer 204 comprises a light-sensitive material such that properties, such as solubility, of the photoresist layer 204 are affected by light. The photoresist layer 204 is either a negative photoresist or a positive photoresist. With respect to a negative photoresist, regions of the negative photoresist become insoluble when illuminated by a light source such that application of a solvent to the negative photoresist during a subsequent development stage removes non-illuminated regions of the negative photoresist. A pattern formed in the negative photoresist is thus a negative of a pattern defined by opaque regions of a template between the light source and the negative photoresist. In a positive photoresist, illuminated regions of the positive photoresist become soluble and are removed via application of a solvent or etchant during development. Thus, a pattern formed in the positive photoresist is a positive image of opaque regions of the template between the light source and the positive photoresist.

In some embodiments, the photoresist layer 204 comprises multiple layers (not shown). According to some embodiments, the photoresist layer 204 comprises three layers: a top layer, a middle layer under the top layer, and a bottom layer under the middle layer. In some embodiments, the top layer comprises a light-sensitive material as described above. In some embodiments, the middle layer comprises an anti-reflective material to aid in at least one of exposure or focus of processing the light-sensitive material. In some embodiments, the bottom layer comprises a hard mask material, such as at least one of nitride or other suitable materials. In some embodiments, the photoresist layer 204 is formed by at least one of physical vapor deposition (PVD), spin coating sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), or other suitable techniques.

In some embodiments, the hard mask layer 202 comprises at least one of oxide, nitride, silicon, or other suitable materials. In some embodiments, the hard mask layer 202 is formed by at least one of physical vapor deposition (PVD), spin coating sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), or other suitable techniques.

In some embodiments, the photoresist layer 204 is in direct contact with the hard mask layer 202. In some embodiments, the photoresist layer 204 and the hard mask layer 202 have a different etch selectivity such that an etchant applied to the photoresist layer 204 and the hard mask layer 202 etches or removes the hard mask layer 202 but does not etch or etches to a lesser degree the photoresist layer 204. A pattern formed in the photoresist layer 204 is thus transferred to the hard mask layer 202 via etching, according to some embodiments. In some embodiments, the photoresist layer 204 and the dielectric layer 104 have a different etch selectivity such that an etchant applied to the photoresist layer 204 and the dielectric layer 104 etches or removes the dielectric layer 104 but does not etch or etches to a lesser degree the photoresist layer 204. A pattern formed in the photoresist layer 204 is thus transferred to the dielectric layer 104 via etching to form a first recess 206, according to some embodiments. In some embodiments, the hard mask layer 202 and the dielectric layer 104 have a different etch selectivity such that an etchant applied to the hard mask layer 202 and the dielectric layer 104 etches or removes the dielectric layer 104 but does not etch or etches to a lesser degree the hard mask layer 202. A pattern formed in the hard mask layer 202 is thus transferred to the dielectric layer 104 via etching to form the first recess 206, according to some embodiments. In some embodiments, the pattern formed in the photoresist layer 204 is transferred to the hard mask layer 202, the photoresist layer 204 is removed, and then the pattern in the hard mask layer 202 is transferred to the dielectric layer 104 to form the first recess 206. In some embodiments, the second hybrid fin 106b is exposed through the first recess 206. In some embodiments, at least one of etching with hydrogen chloride ($HCl_2$), etching with hydrogen sulfide ($H_2S$), dry etching, wet etching, plasma etching, or other suitable techniques are implemented to form the first recess 206. In some embodiments, an etchant used to form the first recess 206 is a gas.

Figure 3:
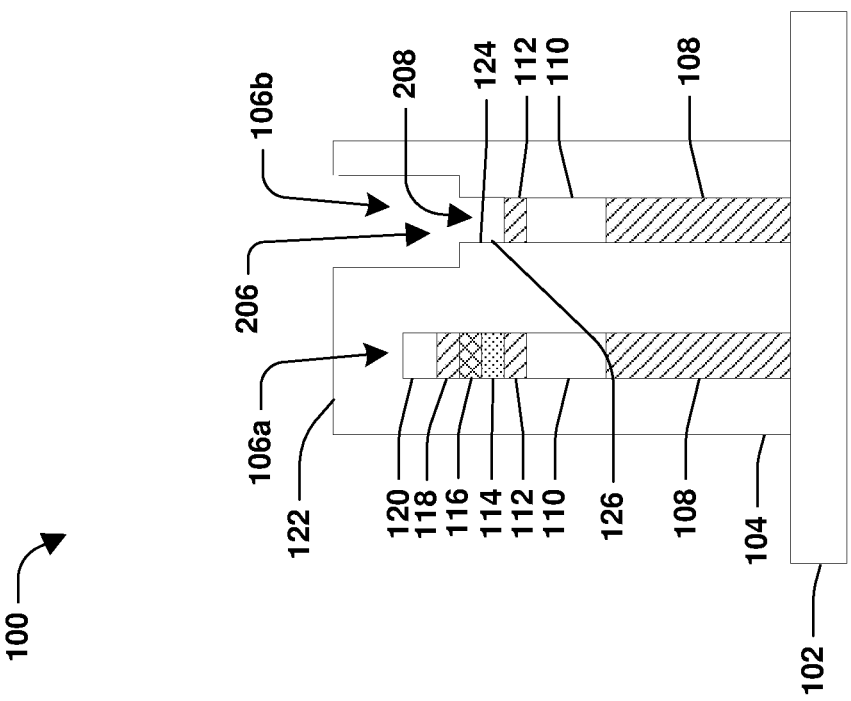

FIG. 3 illustrates a second recess 208 formed in the dielectric layer 104 by removing at least some of the second hybrid fin 106b, according to some embodiments. In some embodiments, at least one of the photoresist layer 204 or the hard mask layer 202 are removed prior to forming the second recess 208. In some embodiments, at least one of the photoresist layer 204 or the hard mask layer 202 are not removed prior to forming the second recess 208.

In some embodiments, at least one of etching with silicon tetrafluoride ($SiF_4$) hydrogen chloride ($HCl_2$), etching with hydrogen sulfide ($H_2S$), etching with silicon tetrachloride ($SiCl_4$), etching with oxygen ($O_2$), etching with nitrogen ($N_2$), etching with chlorine ($Cl_2$), dry etching, wet etching, plasma etching, or other suitable techniques are implemented to form the second recess 208. In some embodiments, an etchant used to form the second recess 208 is a gas. In some embodiments, more of the dielectric layer 104 is removed when the second recess 208 is formed thereby deepening the first recess 206. In some embodiments, an uppermost surface 122 of the dielectric layer 104 that defines the first recess 206 is protected, such as by at least one of the photoresist layer 204 or the hard mask layer 202, when the second recess 208 is formed. In some embodiments, when the uppermost surface 122 of the dielectric layer 104 is protected, an overall height of the dielectric layer 104 experiences little to no reduction even though the first recess 206 is deepened as the second recess 208 is formed.

In some embodiments, an initial etching is used to form the first recess 206. In some embodiments, a first etching is used to form the second recess 208. In some embodiments, the initial etching differs from the first etching in at least one of etching time, etching pressure, etching temperature, etching bias/voltage, etchant composition, etchant concentration, etchant state, such as solid, liquid, plasma, or gas, or any other etching conditions, parameters, etc. In some embodiments, a first portion 124 of a sidewall 126 of the dielectric layer 104 is exposed as some of the second hybrid fin 106b is removed by the first etching. In some embodiments, at least one of the initial etching or the first etching is dynamic in that at least one of etching pressure, etching temperature, etching bias/voltage, etchant composition, etchant concentration, etchant state, such as solid, liquid, plasma, or gas, or any other etching conditions, parameters, etc. varies during at least one of the initial etching or the first etching. In some embodiments, at least one the initial etching or the first etching is performed in one or more stages where etching is halted or nearly halted and then resumed in a subsequent stage. In some embodiments, at least one of etching time, etching pressure, etching temperature, etching bias/voltage, etchant composition, etchant concentration, etchant state, such as solid, liquid, plasma, or gas, or any other etching conditions, parameters, etc. vary during or between one or more stages of at least one the initial etching, the first etching, or other etchings.

Figure 4:
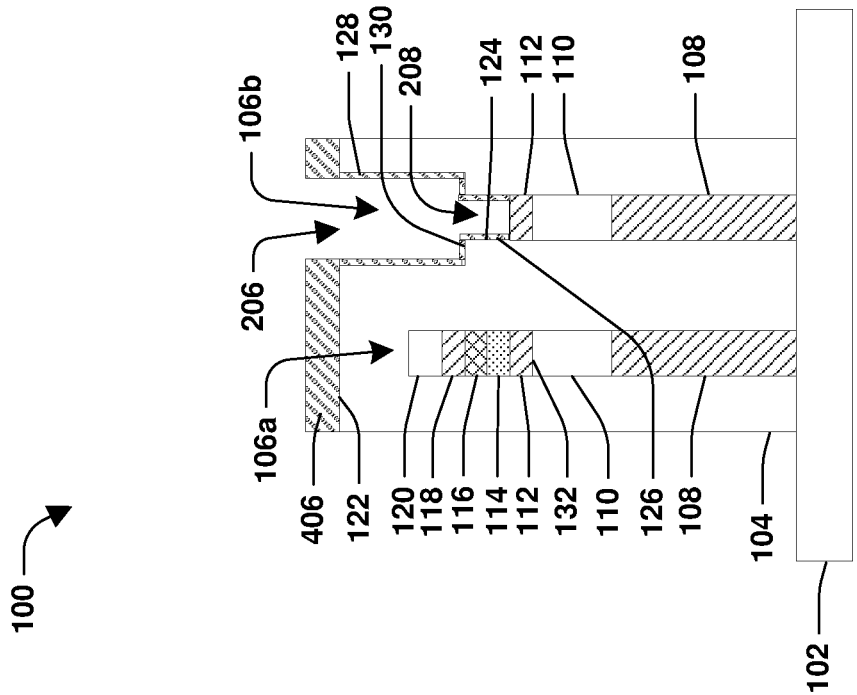

FIG. 4 illustrates the semiconductor arrangement 100 with a first protective layer 406 formed over the uppermost surface 122 of the dielectric layer 104 that defines the first recess 206, a sidewall 128 of the dielectric layer 104 that defines the first recess 206, an upper surface 130 of the dielectric layer 104 that defines the second recess 208, and the first portion 124 of the sidewall 126 of the dielectric layer 104 that defines the second recess, according to some embodiments. In some embodiments, the first protective layer 406 forms during the first etching. In some embodiments, the first protective layer 406 is formed from a first accumulation of by-product material formed from an etchant of the first etching interacting with the second hybrid fin 106b. In some embodiments, the first protective layer 406 comprises at least one of $SiO_2$, $Cl_2$, $SiO_xF_y$, where x and y are integers, an oxygen rich formulation, or $SiO_xCl_y$, where x and y are integers. In some embodiments, the $SiO_2$ is a solid. In some embodiments, the $SiO_2$ is formed from $SiCl_4$ and $O_2$. In some embodiments, the $SiCl_4$ that forms the $SiO_2$ is a gas. In some embodiments, the $O_2$ that forms the $SiO_2$ is a gas. In some embodiments, the $Cl_2$ is a gas. In some embodiments, the $Cl_2$ is formed from $SiCl_4$ and $O_2$. In some embodiments, the $SiCl_4$ that forms the $Cl_2$ is a gas. In some embodiments, the $O_2$ that forms the $Cl_2$ is a gas. In some embodiments, the $SiO_xF_y$ is formed from F radicals and oxygen. In some embodiments, the F radicals that form the $SiO_xF_y$ are a gas. In some embodiments, the oxygen that forms the $SiO_xF_y$ is a gas. In some embodiments, the oxygen rich formulation is formed from $SiF_4$ and $O_2$. In some embodiments, the $SiF_4$ that forms the oxygen rich formulation is a gas. In some embodiments, the $O_2$ that forms the oxygen rich formulation is a gas. In some embodiments, $SiO_xCl_y$ is formed from $SiCl_4$ and $O_2$. In some embodiments, the $SiCl_4$ that forms the $SiO_xCl_y$ is a gas. In some embodiments, the $O_2$ that forms the $SiO_xCl_y$ is a gas.

In some embodiments, the formation of the first protective layer 406 as the second recess 208 is formed by the first etching inhibits unwanted removal of, at least, the dielectric layer 104 by one or more etchants of the first etching. Inhibiting such unwanted removal also inhibits unwanted particles, debris, etc., such as from the dielectric layer 104, from falling into, clogging, etc. the second recess 208 as the first etching occurs. In some embodiments, such particles, debris, etc. in the second recess 208 retard the progress of the first etching in removing the second hybrid fin 106b to form or deepen the second recess 208. In some embodiments, such particles, debris, etc. in the second recess 208 retard the progress of the first etching because such particles, debris, etc. have a different etch selectivity as comparted to materials of the second hybrid fin 106b. In some embodiments, when such particles, debris, etc. are in the second recess 208, one or more etchants of the first etching etch laterally more than desired. In some embodiments, inhibiting such unwanted removal further inhibits adverse effects to the first hybrid fin 106a. In some embodiments, adverse effects to the first hybrid fin 106a occur where not enough of the dielectric layer 104 remains around the first hybrid fin 106a, such as where too much lateral etching occurs. In some embodiments, where not enough of the dielectric layer 104 remains around the first hybrid fin 106a, the first hybrid fin 106a is itself impacted by one or more etchants of the first etching, such as where at least one of the first recess 206 or the second recess 208 is made too large or wide, potentially exposing the first hybrid fin 106a to one or more etchants of the first etching. In some embodiments, the first hybrid fin 106a operates as a vertical transistor. In some embodiments, operation of a vertical transistor is improved when the vertical transistor has a high aspect ratio. In some embodiments, the first hybrid fin 106a has a relatively high aspect ratio so that the first hybrid fin 106a functions as desired when operated as a vertical transistor. In some embodiments, the second hybrid fin 106b has a relatively high aspect ratio prior to at least one of the initial etching or the first etching. In some embodiments, the second recess 208 is formed to have a high aspect ratio reflective of the high aspect ratio of the second hybrid fin 106b to increase the likelihood that the first hybrid fin 106a will not be adversely affected by the first etching, such as where the first etching etches laterally too much and exposes the first hybrid fin 106a to one or more etchants of the first etching which alter, such as reduce, the aspect ratio of the first hybrid fin 106a.

FIG. 5 illustrates the semiconductor arrangement 100 after a first flash is performed to remove at least some of the first protective layer 406, according to some embodiments. In some embodiments, the first flash removes at least some of the first protective layer 406 from at least one of at least some of the uppermost surface 122 of the dielectric layer 104 that defines the first recess 206, at least some of the sidewall 128 of the dielectric layer 104 that defines the first recess 206, at least some of the upper surface 130 of the dielectric layer 104 that defines the second recess 208, or at least some of the first portion 124 of the sidewall 126 of the dielectric layer 104 that defines the second recess. In some embodiments, the first flash comprises using at least one of oxygen, nitrogen, sulfur dioxide, or other suitable materials.

In some embodiments, the first flash comprises using plasma. In some embodiments, the first flash removes at least some particles, debris, etc. that are in the second recess 208. In some embodiments, chemical mechanical polishing (CMP) is performed after the first flash to remove residual amounts of the first protective layer 406, such as from the uppermost surface 122 of the dielectric layer 104. In some embodiments, one or more additional cycles of etching and flashing are implemented to form the second recess 208 to a desired depth. In some embodiments, one or more additional cycles of etching and flashing are implemented to form the second recess 208 to have a desired aspect ratio.

FIG. 6 illustrates the semiconductor arrangement 100 after a second etching is used to deepen the second recess 208, according to some embodiments. In some embodiments, at least one of etching with silicon tetrafluoride ($SiF_4$) hydrogen chloride ($HCl_2$), etching with hydrogen sulfide ($H_2S$), etching with silicon tetrachloride ($SiCl_4$), etching with oxygen ($O_2$), etching with nitrogen ($N_2$), etching with chlorine ($Cl_2$), dry etching, wet etching, plasma etching, or other suitable techniques are implemented in the second etching. In some embodiments, an etchant used in the second etching is a gas. In some embodiments, more of the dielectric layer 104 is removed during the second etching thereby deepening the first recess 206. In some embodiments, the uppermost surface 122 of the dielectric layer 104 that defines the first recess 206 is protected, such as by at least one of a photoresist layer or a hard mask layer, when the second etching is performed. In some embodiments, when the uppermost surface 122 of the dielectric layer 104 is protected, an overall height of the dielectric layer 104 experiences little to no reduction even though the first recess 206 is deepened as the second etching is performed.

In some embodiments, the second etching differs from at least one of the initial etching or the first etching in at least one of etching time, etching pressure, etching temperature, etching bias/voltage, etchant composition, etchant concentration, etchant state, such as solid, liquid, plasma, or gas, or any other etching conditions, parameters, etc. In some embodiments, a second portion 132 of the sidewall 126 of the dielectric layer 104 is exposed as more of the second hybrid fin 106b is removed by the second etching. In some embodiments, the second etching is dynamic in that at least one of etching pressure, etching temperature, etching bias/voltage, etchant composition, etchant concentration, etchant state, such as solid, liquid, plasma, or gas, or any other etching conditions, parameters, etc. varies during the second etching. In some embodiments, the second etching is performed in one or more stages where etching is halted or nearly halted and then resumed in a subsequent stage. In some embodiments, at least one of etching time, etching pressure, etching temperature, etching bias/voltage, etchant composition, etchant concentration, etchant state, such as solid, liquid, plasma, or gas, or any other etching conditions, parameters, etc. vary during or between one or more stages of the second etching.

Figure 7:
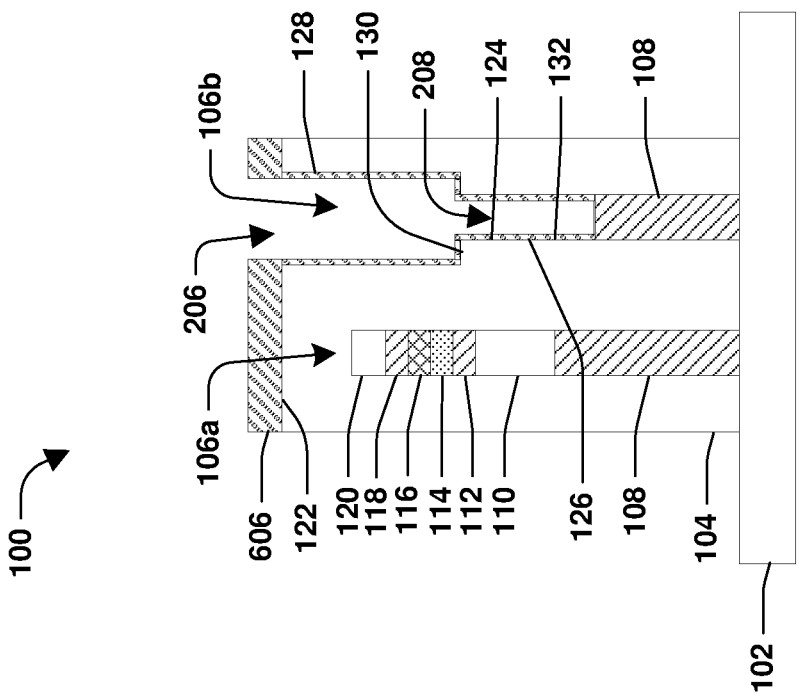

FIG. 7 illustrates the semiconductor arrangement 100 with a second protective layer 606 formed over the uppermost surface 122 of the dielectric layer 104 that defines the first recess 206, the sidewall 128 of the dielectric layer 104 that defines the first recess 206, the upper surface 130 of the dielectric layer 104 that defines the second recess 208, the first portion 124 of the sidewall 126 of the dielectric layer 104 that defines the second recess 208, and the second portion 132 of the sidewall 126 of the dielectric layer 104 that defines the second recess 208, according to some embodiments. In some embodiments, the second protective layer 606 forms during the second etching. In some embodiments, the second protective layer 606 is formed from a second accumulation of by-product material formed from an etchant of the second etching interacting with the second hybrid fin 106b. In some embodiments, the second protective layer 606 comprises at least one of $SiO_2$, $Cl_2$, $SiO_xF_y$, where x and y are integers, an oxygen rich formulation, or $SiO_xCl_y$, where x and y are integers. In some embodiments, the $SiO_2$ is a solid. In some embodiments, the $SiO_2$ is formed from $SiCl_4$ and $O_2$. In some embodiments, the $SiCl_4$ that forms the $SiO_2$ is a gas. In some embodiments, the $O_2$ that forms the $SiO_2$ is a gas. In some embodiments, the $Cl_2$ is a gas. In some embodiments, the $Cl_2$ is formed from $SiCl_4$ and $O_2$. In some embodiments, the $SiCl_4$ that forms the $Cl_2$ is a gas. In some embodiments, the $O_2$ that forms the $Cl_2$ is a gas. In some embodiments, the $SiO_xF_y$ is formed from F radicals and oxygen. In some embodiments, the F radicals that form the $SiO_xF_y$ are a gas. In some embodiments, the oxygen that forms the $SiO_xF_y$ is a gas. In some embodiments, the oxygen rich formulation is formed from $SiF_4$ and $O_2$. In some embodiments, the $SiF_4$ that forms the oxygen rich formulation is a gas. In some embodiments, the $O_2$ that forms the oxygen rich formulation is a gas. In some embodiments, the $SiO_xCl_y$ is formed from $SiCl_4$ and $O_2$. In some embodiments, the $SiCl_4$ that forms the $SiO_xCl_y$ is a gas. In some embodiments, the $O_2$ that forms the $SiO_xCl_y$ is a gas. In some embodiments, the second protective layer 606 has a same composition as the first protective layer 406. In some embodiments, the second protective layer 606 does not have a same composition as the first protective layer 406.

In some embodiments, the formation of the second protective layer 606 as the second recess 208 is deepened by the second etching inhibits unwanted removal of, at least, the dielectric layer 104 by one or more etchants of the second etching. Inhibiting such unwanted removal also inhibits unwanted particles, debris, etc., such as from the dielectric layer 104, from falling into, clogging, etc. the second recess 208 as the second etching occurs. In some embodiments, such particles, debris, etc. in the second recess 208 retard the progress of the second etching in removing the second hybrid fin 106b to deepen the second recess 208. In some embodiments, such particles, debris, etc. in the second recess 208 retard the progress of the second etching because such particles, debris, etc. have a different etch selectivity as compared to materials of the second hybrid fin 106b. In some embodiments, when such particles, debris, etc. are in the second recess 208, one or more etchants of the second etching etch laterally more than desired. In some embodiments, inhibiting such unwanted removal further inhibits adverse effects to the first hybrid fin 106a. In some embodiments, adverse effects to the first hybrid fin 106a occur where not enough of the dielectric layer 104 remains around the first hybrid fin 106a, such as where too much lateral etching occurs. In some embodiments, where not enough of the dielectric layer 104 remains around the first hybrid fin 106a, the first hybrid fin 106a is itself impacted by one or more etchants of the second etching, such as where at least one of the first recess 206 or the second recess 208 is made too large or wide, potentially exposing the first hybrid fin 106a to one or more etchants of the second etching. In some embodiments, the second recess 208 is formed to have the high aspect ratio reflective of the high aspect ratio of the second hybrid fin 106b to increase the likelihood that the first hybrid fin 106a will not be adversely affected by the second etching, such as where the second etching etches laterally too much and exposes the first hybrid fin 106a to one or more etchants of the second etching which alter, such as reduce, the aspect ratio of the first hybrid fin 106a.

Figure 8:
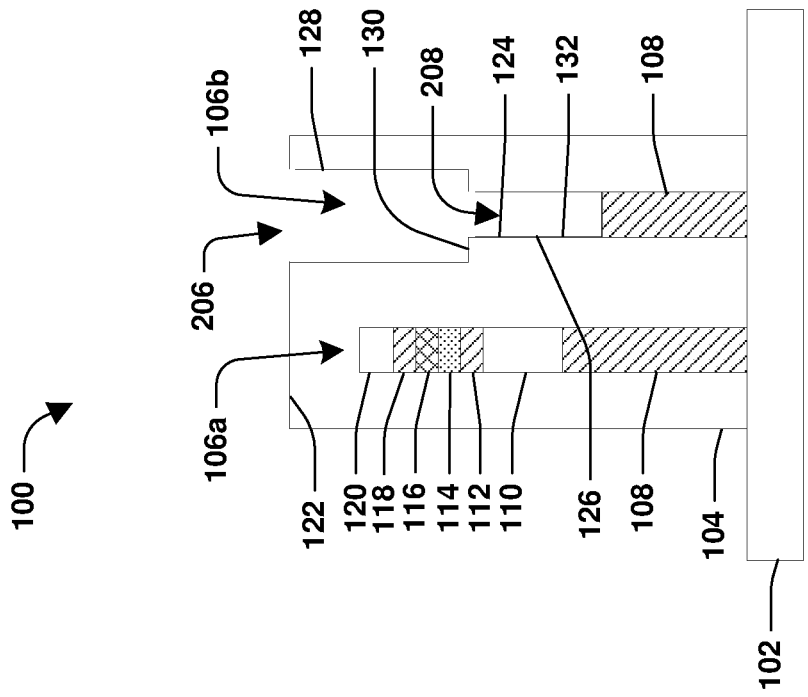

FIG. 8 illustrates the semiconductor arrangement 100 after a second flash is performed to remove at least some of the second protective layer 606, according to some embodiments. In some embodiments, the second flash removes at least some of the second protective layer 606 from at least one of at least some of the uppermost surface 122 of the dielectric layer 104 that defines the first recess 206, at least some of the sidewall 128 of the dielectric layer 104 that defines the first recess 206, at least some of the upper surface 130 of the dielectric layer 104 that defines the second recess 208, at least some of the first portion 124 of the sidewall 126 of the dielectric layer 104 that defines the second recess 208, or at least some of the second portion 132 of the sidewall 126 of the dielectric layer 104 that defines the second recess. In some embodiments, the second flash comprises using at least one of oxygen, nitrogen, sulfur dioxide, or other suitable materials. In some embodiments, the second flash comprises using plasma. In some embodiments, the second flash removes at least some particles, debris, etc. that are in the second recess 208. In some embodiments, CMP is performed after the second flash to remove residual amounts of the second protective layer 606, such as from the uppermost surface 122 of the dielectric layer 104. In some embodiments, the second flash is implemented in a same manner as the first flash. In some embodiments, the second flash is implemented in a different manner than the first flash, such as using one or more different chemicals. In some embodiments, one or more additional cycles of etching and flashing are implemented to form the second recess 208 to a desired depth. In some embodiments, one or more additional cycles of etching and flashing are implemented to form the second recess 208 to have a desired aspect ratio. In some embodiments, one or more flashes are implemented in the same or different manners as one or more other flashes. According to some embodiments, the cyclic etching/flashing is suitable for a wide range of high aspect ratio applications, such as nanowires, and is not limited to the specific structures, materials, etc. described herein.

In some embodiments, a minimum desired height of the upper surface 130 of the dielectric layer 104 that defines the second recess 208 is at an elevation above an uppermost surface of an adjacent hybrid fin, such as the first hybrid fin 106a. In some embodiments, the uppermost surface of the first hybrid fin 106a does not include at least one of the second Si layer 112, the pad oxide layer 114, the silicon carbide nitrogen (SiCN) layer 116, the pad Si layer 118, or the silicon nitride (SiN) layer 120. In some embodiments, the uppermost surface of the first hybrid fin 106a corresponds to the silicon germanium (SiGe) layer 110, but the instant disclosure is not so limited. In some embodiments, the first hybrid fin 106a operates as a transistor or other suitable arrangement and maintaining the minimum desired height of the upper surface 130 of the dielectric layer 104 that defines the second recess 208 at an elevation above the uppermost surface of the first hybrid fin 106a promotes desired operation of the first hybrid fin 106a.

Figure 9:
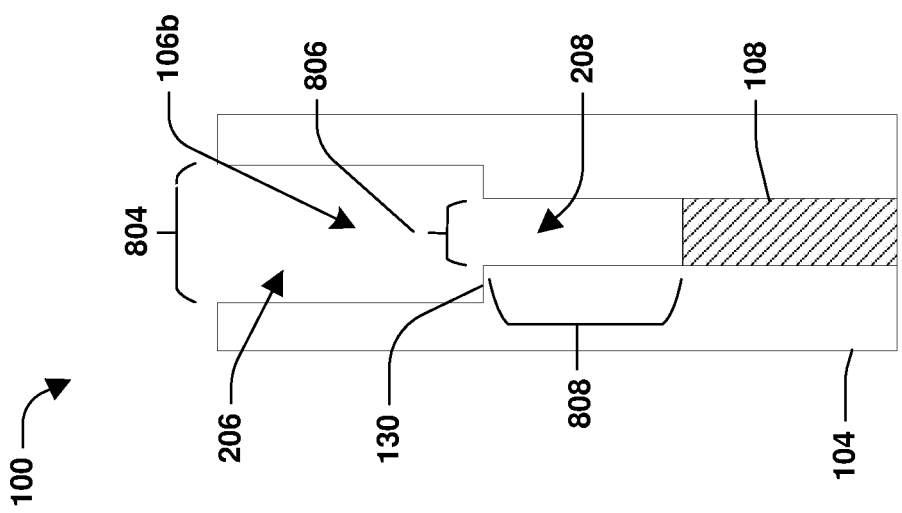

FIG. 9 illustrates a zoomed in view of the semiconductor arrangement 100 to show one or more critical dimensions (CDs), according to some embodiments. In some embodiments, the first recess 206 has a first width 804 of approximately 50 nm. In some embodiments, the second recess 208 has a second width 806 of approximately 10 nm. In some embodiments, the second width 806 is the same as or approximates a width of the second hybrid fin 106b. In some embodiments, the first width 804 is greater than the second width 806. In some embodiments, the second recess 208 has a depth 808 of approximately 100 nm. In some embodiments, the second recess 208 has a relatively high aspect depth-to-width ratio of 100 nm/10 nm or 10. Other aspect ratios are contemplated, according to some embodiments. In some embodiments, at least one of the second width 806 is decreased or the depth 808 is increased to achieve a greater aspect ratio.

Figure 10:
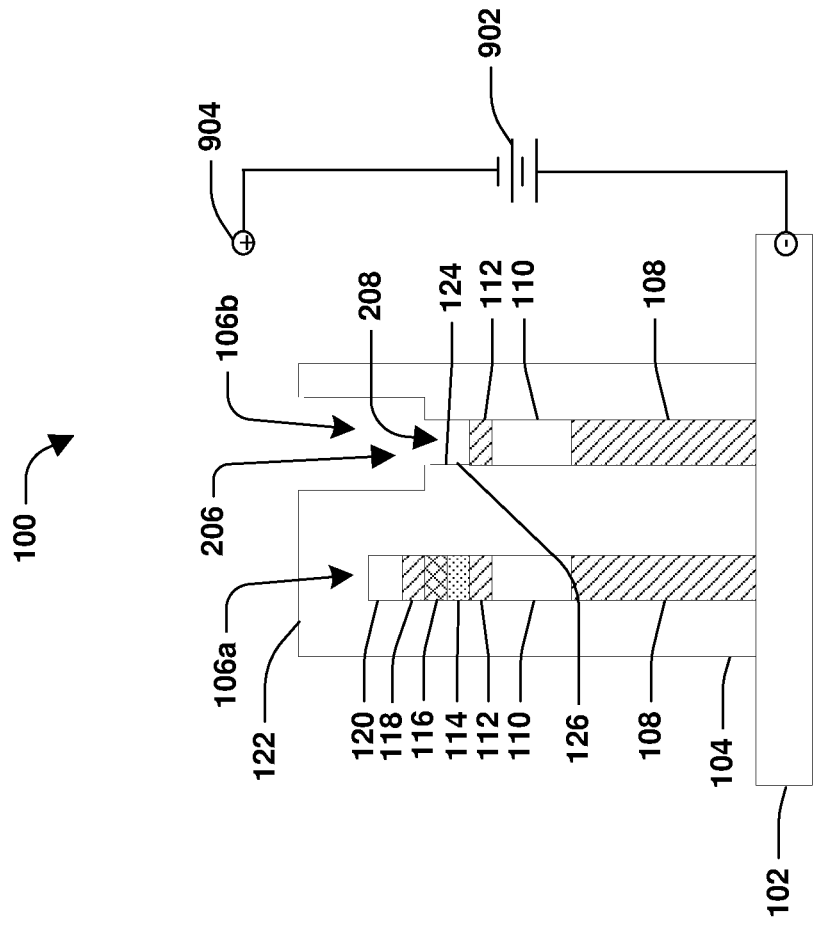

FIG. 10 illustrates an electrical bias applied to the semiconductor arrangement 100, such as during the first etching described with respect to FIGS. 3 and 4, according to some embodiments. An electrical bias is applied to any stages of any one or more operations described herein, such as at least one of etching or flashing, according to some embodiments. In some embodiments, the etching is a chemical process having a reaction rate and the electrical bias 904 serves as a catalyst to alter, such as increase, the reaction rate. According to some embodiments, a voltage source 902 that generates a DC or AC electrical bias 904 is applied to the semiconductor arrangement 100. In some embodiments, the electrical bias 904 is applied to an etchant and one or more layers of the semiconductor arrangement 100, such as the substrate 102, to establish a potential difference between the etchant and the one or more layers. In some embodiments, the electrical bias is applied to an etchant by being applied to a cathode or anode, such as disposed in a chamber wherein the etchant is introduced, present, etc. In some embodiments, the electrical bias 904 is applied to one or more layers of the semiconductor arrangement 100, such as to establish a potential difference between a first layer and a second layer where the first layer or the second layer may or may not be the substrate 102 and the first layer and the second layer may or may not be contact with one another. Other configurations are contemplated, according to some embodiments. In some embodiments, the electrical bias serves to generate a plasma, such as for flashing. In some embodiments the electrical bias generates a plasma by being applied to a cathode or anode, such as disposed in a chamber wherein one or more chemicals, agents, etc. are introduced, present, etc., and to one or more layers, such as the substrate 102, of the semiconductor arrangement 100 to establish a potential difference between the cathode or anode and the one or more layers. Applying the electrical bias 904 during etching facilitates formation of the protective layer, according to some embodiments. Applying the electrical bias 904 during etching improves the efficiency of the etching and reduces the time required to form at least one of the first recess 206 or the second recess, according to some embodiments. In some embodiments, applying the electrical bias 904 during etching improves etching depth uniformity and forms at least one of a more vertical first profile of the first recess 206 or a more vertical second profile of the second recess 208. In some embodiments, the electrical bias 904 has a magnitude of 1000 volts or more depending on at least one of a desired depth of the first recess 206, a desired depth of the second recess 208, a desired etch time, a desired plasma to be developed, one or more materials being etched, one or more materials being flashed, or other suitable factors, considerations, etc.

According to some embodiments, a method for fabricating a semiconductor arrangement includes performing a first etching of a semiconductive structure to expose a first portion of a sidewall of a first layer adjacent the semiconductive structure. In some embodiments, the first etching forms a first protective layer on the first portion of the sidewall of the first layer. In some embodiments, the first protective layer is formed from a first accumulation of by-product material formed from an etchant of the first etching interacting with the semiconductive structure. In some embodiments, the method includes performing a first flash to remove at least some of the first protective layer.

In some embodiments, the method includes performing, after the first flash, a second etching of the semiconductive structure to expose a second portion of the sidewall of the first layer. In some embodiments, the second etching forms a second protective layer on the first portion of the sidewall of the first layer and on the second portion of the sidewall of the first layer. In some embodiments, the second protective layer is formed from a second accumulation of by-product material formed from a second etchant of the second etching interacting with the semiconductive structure.

In some embodiments, the method includes performing a second flash to remove at least some of the second protective layer.

In some embodiments, performing the first flash includes using plasma.

In some embodiments, performing the first flash includes using at least one of oxygen, nitrogen, or sulfur dioxide.

In some embodiments, performing the first etching includes applying an electrical bias to the semiconductor arrangement.

In some embodiments, the electrical bias is greater than or equal to 1000 volts.

In some embodiments, the first protective layer includes at least one of $SiO_xF_y$ or $SiO_xCl_y$, where x is a positive integer and y is a positive integer.

In some embodiments, the method includes performing, after the first flash, chemical mechanical polishing (CMP) to remove residual amounts of the first protective layer.

According to some embodiments, a method for fabricating a semiconductor arrangement includes performing a first etching of a semiconductive structure to expose a first portion of a sidewall of a first layer adjacent the semiconductive structure. In some embodiments, performing the first etching includes exposing the semiconductive structure to a first etchant to remove a stack of materials including at least one of a silicon germanium layer, a silicon layer, an oxide layer, a silicon carbide nitrogen layer, or a silicon nitride layer, and forming a first protective layer on the first portion of the sidewall of the first layer.

In some embodiments, the first protective layer is formed from a first accumulation of by-product material formed from the first etchant interacting with the semiconductive structure.

In some embodiments, the method includes performing a first flash to remove at least some of the first protective layer.

In some embodiments, the method includes performing, after the first flash, a second etching of the semiconductive structure to expose a second portion of the sidewall of the first layer, wherein the second etching forms a second protective layer on the first portion of the sidewall of the first layer and on the second portion of the sidewall of the first layer.

In some embodiments, the first etchant includes at least one of SiCl4 or O2.

In some embodiments, performing the first etching includes applying an electrical bias to form the first protective layer.

In some embodiments, the first protective layer includes at least one of $SiO_xF_y$ or $SiO_xCl_y$, where x is a positive integer and y is a positive integer.

According to some embodiments, a method for fabricating a semiconductor arrangement includes forming a first recess in a first layer to expose a first semiconductive structure underlying the first layer In some embodiments, the method includes forming a second recess in the first layer by removing at least some of the first semiconductive structure, wherein an upper surface of the first layer that defines the second recess is above an uppermost surface of a second semiconductive structure adjacent the first semiconductive structure.

In some embodiments, forming the second recess includes performing a first etching of the first semiconductive structure to expose a first portion of a sidewall of the first layer adjacent the first semiconductive structure, wherein the first etching forms a first protective layer on the first portion of the sidewall of the first layer and the first protective layer is formed from a first accumulation of by-product material formed from an etchant of the first etching interacting with the first semiconductive structure.

In some embodiments, forming the second recess includes performing a first flash to remove at least some of the first protective layer.

In some embodiments, the method includes performing, after the first flash, a second etching of the first semiconductive structure to expose a second portion of the sidewall of the first layer, wherein the second etching forms a second protective layer on the first portion of the sidewall of the first layer and on the second portion of the sidewall of the first layer and the second protective layer is formed from a second accumulation of by-product material formed from an etchant of the second etching interacting with the first semiconductive structure.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure includes all such modifications and alterations and is limited only by the scope of the following claims. In particular regard to the various functions performed by the above described components the terms used to describe such components are intended to correspond, unless otherwise indicated, to any component which performs the specified function of the described component (for example, a term that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for fabricating a semiconductor arrangement, comprising:
    performing a first etching of a semiconductive structure to expose a first portion of a sidewall of a first layer adjacent the semiconductive structure, wherein:
        a material composition of the first layer is different than a material composition of the semiconductor structure,
        the first etching forms a first protective layer on the first portion of the sidewall of the first layer, and
        the first protective layer is formed from a first accumulation of by-product material formed from an etchant of the first etching interacting with the semiconductive structure; and
    performing a first flash to remove at least some of the first protective layer.

2. The method of claim 1, comprising:
    performing, after the first flash, a second etching of the semiconductive structure to expose a second portion of the sidewall of the first layer, wherein:
        the second etching forms a second protective layer on the first portion of the sidewall of the first layer and on the second portion of the sidewall of the first layer, and
        the second protective layer is formed from a second accumulation of by-product material formed from a second etchant of the second etching interacting with the semiconductive structure.

3. The method of claim 2, comprising:
    performing a second flash to remove at least some of the second protective layer.

4. The method of claim 1, wherein performing the first flash comprises using plasma.

5. The method of claim 1, wherein performing the first flash comprises using at least one of oxygen, nitrogen, or sulfur dioxide.

6. The method of claim 1, wherein performing the first etching comprises applying an electrical bias to the semiconductor arrangement.

7. The method of claim 6, wherein the electrical bias is greater than or equal to 1000 volts.

8. The method of claim 1, wherein the first protective layer comprises at least one of $SiO_xF_y$ or $SiO_xCl_y$, where x is a positive integer and y is a positive integer.

9. The method of claim 1, comprising:
    performing, after the first flash, chemical mechanical polishing (CMP) to remove residual amounts of the first protective layer.

10. A method for fabricating a semiconductor arrangement, comprising:
    forming a first layer over and adjacent a semiconductive structure, wherein a material composition of the first layer is different than a material composition of the semiconductive structure; forming a hard mask over the first layer, wherein a first portion of the first layer is exposed through the hard mask; performing a first etching of the semiconductive structure to expose a first portion of a sidewall of a second portion of the first layer adjacent the semiconductive structure, wherein:
        the first etching forms a first protective layer on the first portion of the sidewall of the second portion of the first layer, and the first protective layer is formed from a first accumulation of by-product material formed from an etchant of the first etching interacting with the semiconductive structure; and performing a first flash to remove at least some of the first protective layer.

11. The method of claim 10, wherein performing the first flash comprises using plasma.

12. The method of claim 10, wherein performing the first flash comprises using at least one of oxygen, nitrogen, or sulfur dioxide.

13. The method of claim 10, wherein performing the first etching comprises applying an electrical bias to the semiconductor arrangement.

14. The method of claim 13, wherein the electrical bias is greater than or equal to 1000 volts.

15. The method of claim 10, wherein the first protective layer comprises at least one of $SiO_xF_y$ or $SiO_xCl_y$, where x is a positive integer and y is a positive integer.

16. The method of claim 10, comprising: performing, after the first flash, chemical mechanical polishing (CMP) to remove residual amounts of the first protective layer.

17. A method for fabricating a semiconductor arrangement, comprising:
    performing a first etching of a semiconductive structure to expose a first portion of a sidewall of a first layer adjacent the semiconductive structure, wherein:

a material composition of the first layer is different than a material composition of the semiconductive structure, the first etching forms a first protective layer on the first portion of the sidewall of the first layer, and the first protective layer is formed from a first accumulation of by-product material formed from an etchant of the first etching interacting with the semiconductive structure; and removing at least some of the first protective layer.

18. The method of claim 17, comprising: performing, after removing the at least some of the first protective layer, a second etching of the semiconductive structure to expose a second portion of the sidewall of the first layer, wherein: the second etching forms a second protective layer on the first portion of the sidewall of the first layer and on the second portion of the sidewall of the first layer, and the second protective layer is formed from a second accumulation of by-product material formed from a second etchant of the second etching interacting with the semiconductive structure.

19. The method of claim 17, wherein the first protective layer comprises at least one of $SiO_xF_y$ or $SiO_xCl_y$, where x is a positive integer and y is a positive integer.

20. The method of claim 17, comprising: performing, after removing the at least some of the first protective layer, chemical mechanical polishing (CMP) to remove residual amounts of the first protective layer.

* * * * *